United States Patent
Jain et al.

(10) Patent No.: US 9,628,089 B1
(45) Date of Patent: Apr. 18, 2017

(54) SUPPLY VOLTAGE TRACKING CLOCK GENERATOR IN ADAPTIVE CLOCK DISTRIBUTION SYSTEMS

(71) Applicant: QUALCOMM Incorporated, San Diego, CA (US)

(72) Inventors: Palkesh Jain, Bangalore (IN); Keith Alan Bowman, Morrisville, NC (US); Virendra Bansal, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/192,996

(22) Filed: Jun. 24, 2016

(51) Int. Cl.
*H03L 7/08* (2006.01)
*H03K 3/03* (2006.01)
*H03K 5/135* (2006.01)
*H03K 5/00* (2006.01)

(52) U.S. Cl.
CPC ......... *H03L 7/0802* (2013.01); *H03K 3/0315* (2013.01); *H03K 5/135* (2013.01); *H03K 2005/00019* (2013.01)

(58) Field of Classification Search
CPC ..... H03L 7/0802; H03K 3/0315; H03K 5/135
USPC ........................................................ 327/149
See application file for complete search history.

(56) References Cited

U.S. PATENT DOCUMENTS

| | | | |
|---|---|---|---|
| 6,487,668 B2 * | 11/2002 | Thomas | G06F 1/206 713/322 |
| 6,586,971 B1 | 7/2003 | Naffziger et al. | |
| 6,762,629 B2 | 7/2004 | Tam et al. | |
| 6,922,111 B2 * | 7/2005 | Kurd | G06F 1/10 331/48 |
| 6,995,621 B1 * | 2/2006 | Culler | H03L 7/0995 331/1 A |
| 8,269,544 B2 | 9/2012 | Greenhill et al. | |
| 8,669,794 B2 | 3/2014 | Park et al. | |
| 8,928,385 B2 * | 1/2015 | Kim | H03K 21/00 327/114 |
| 2004/0183613 A1 * | 9/2004 | Kurd | G01K 7/32 331/186 |
| 2005/0138444 A1 * | 6/2005 | Gaskins | G06F 1/08 713/300 |
| 2012/0017106 A1 * | 1/2012 | Curren | G06K 7/10297 713/340 |
| 2012/0187991 A1 * | 7/2012 | Sathe | H03K 5/135 327/158 |
| 2014/0254734 A1 * | 9/2014 | Abdelmoneum | H03L 7/0995 375/376 |
| 2016/0072491 A1 | 3/2016 | Bowman | |

* cited by examiner

*Primary Examiner* — Ryan Jager
(74) *Attorney, Agent, or Firm* — Muncy, Geissler, Olds & Lowe, P.C.

(57) ABSTRACT

An adaptive clock distribution (ACD) system with a voltage tracking clock generator (VTCG) is disclosed. The ACD system includes a tunable-length delay (TLD) circuit, to generate a TLD clock by adding a preselected delay to a root clock, and a voltage droop detector for detecting a voltage droop in a supply voltage. The VTCG is configured to generate a VTCG clock, wherein a frequency of the VTCG clock is finely tuned to one of two or more values to correspond to a magnitude of the supply voltage during the voltage droop. A clock selector selects the VTCG clock as an ACD clock to be provided to an electronic circuit during the voltage droop and the TLD clock as the ACD clock when there is no voltage droop detected.

27 Claims, 6 Drawing Sheets

SUPPLY VOLTAGE TRACKING CLOCK GENERATOR IN ADAPTIVE CLOCK DISTRIBUTION SYSTEMS

FIELD OF DISCLOSURE

Disclosed aspects relate to adaptive clock distribution systems. More specifically, exemplary aspects are directed to tracking supply voltage variations and adapting clock generation based on voltage droops.

BACKGROUND

A stable, regulated supply voltage (Vdd) is desirable in electronic circuits such as integrated circuits for processing systems, systems-on-chips (SoCs), etc. Abrupt changes in switching activity of the electronic circuits, for example, may cause a droop in supply voltage (referred to herein as, a "voltage droop"), inducing large current transients in voltage or power-delivery systems for the electronic circuits. Voltage droops can have a global effect across all circuits integrated on a semiconductor die and may be random and unpredictable in their occurrence.

Voltage droops can degrade the performance and energy efficiency of the electronic circuits, a problem which may be exacerbated in high-frequency or high performance designs. In an effort to mitigate the effects of voltage droops, some techniques identify a minimum acceptable operating voltage at which an electronic circuit can function at an acceptable frequency without degrading performance. A "guard band" is then calculated based on the worst case voltage droop which may be possible. The supply voltage is designed to be greater than the minimum acceptable operating voltage by at least the guard band. This way, even under the worst case voltage droop, the supply voltage would not fall below the minimum acceptable operating voltage. However, in designing for this worst case scenario (which, as noted above, may be random and possibly, relatively rare), the supply voltage is maintained at a much higher level even when there is no voltage droop, resulting in unnecessary wastage of power.

Other techniques to mitigate the effects of voltage droops involve adding hardware structures such as de-coupling capacitors to semiconductor dies or packages, but such structures are seen to be ineffective, especially in cases where the voltage droops may have large variation in their values.

Some conventional techniques also attempt to reduce the frequency of a system clock used to operate the electronic circuit, upon detection of a voltage droop in an effort to slow down the electronic circuit and maintain proper functionality at the lower supply voltage resulting from the voltage droop. For example, a feedback path may be provided to a phase-locked loop (PLL) used to generate the system clock, to indicate to the PLL that a voltage droop has occurred. Based on the indication, the PLL may reduce the frequency of the system clock (e.g., by a factor of two to reduce the operating frequency of the electronic circuit by half) to account for the reduced supply voltage. In some cases, a clock-divider circuit may be used to reduce the frequency of the clock generated by the PLL. In these approaches, a time lag or response time may be involved, from the point in time when the onset of the voltage droop is detected to the time when the clock frequency of the electronic circuit is reduced. This response time may be significant and span several clock cycles during which the electronic circuit may be operated at the original clock frequency but at the reduced supply voltage caused by the voltage droop. The voltage droops can have nearly immediate impact on the electronic circuit, particularly at high operating frequencies, and therefore the high response times in conventional techniques can expose the electronic circuit to various error conditions, some of which may be irreversible.

To combat the aforementioned problems associated with response times, an adaptive clock distribution (ACD) system has been proposed (see, e.g., U.S. patent application Ser. No. 14/668,041 filed on Mar. 25, 2015 and entitled "AUTOMATIC CALIBRATION CIRCUITS FOR IN-FIELD, OPERATIONAL CALIBRATION OF CRITICAL-PATH TIME DELAYS IN ADAPTIVE CLOCK DISTRIBUTION SYSTEMS, AND RELATED METHODS AND SYSTEMS," hereinafter, "the '041 Application"). In the event of a voltage droop, the ACD system of the '041 Application utilizes a clock-data delay compensation technique to provide an acceptable response time during which the clock frequency may be adaptively reduced without affecting the performance of the electronic circuit. In this regard, a tunable-length delay (TLD) element is provided in the ACD system, to introduce a TLD in a clock generation path of a system clock before the system clock is provided to a global clock distribution network. The TLD effectively prolongs the clock-data delay compensation in circuit paths of the electronic circuit for one or more clock cycles after the onset of a voltage droop, which provides a sufficient response time for adaptively reducing the clock frequency. The clock period at the output of the TLD element is designed to track the voltage variation in supply voltage for a time duration which is equal to the TLD. As the circuit paths slow down during the voltage droop, the clock period at the output of the TLD element increases to compensate for the slow down. Thus, the timing margin (calculated as clock period minus path delay) remains unchanged for a time duration which is equal to the delay of the TLD element. The ACD system also includes a dynamic variation monitor (DVM) or droop detector to detect the onset of the voltage droop, along with an adaptive control unit and clock divider to reduce clock frequency by half at the output of the TLD element to avoid timing-margin failures.

Although the above-described ACD system of the '041 Application can improve performance by adaptively responding to relatively rare voltage droops of large magnitudes, the performance benefits of the ACD system may reduce as the number of clock cycles at which the electronic circuit is operated at half the clock frequency Fclk increases. Accordingly, there is a continuing need in the art for effective techniques which can combat the negative effects of voltage droops in electronic circuits while avoiding the aforementioned limitations of prior approaches in this regard.

SUMMARY

Exemplary embodiments of the invention are directed to an adaptive clock distribution (ACD) system with a voltage tracking clock generator (VTCG) for generating a clock with a frequency which is finely tuned to the magnitude of a supply voltage, for improved performance of an electronic circuit during voltage droops.

For example, an exemplary aspect is directed to an adaptive clock distribution (ACD) system comprising a tunable-length delay (TLD) circuit configured to add a preselected delay to a root clock, to generate a TLD clock, a voltage droop detector configured to detect a voltage droop in a supply voltage, and a voltage tracking clock generator (VTCG) configured to generate a VTCG clock, wherein a frequency of the VTCG clock is finely tuned to one of two or more values to correspond to a magnitude of the supply voltage during the voltage droop. A clock selector configured to select the VTCG clock as an ACD clock to be provided to an electronic circuit during the voltage droop and the TLD clock as the ACD clock when there is no voltage droop detected.

Another exemplary aspect is directed to a method of operating an adaptive clock distribution (ACD) system, the method comprising adding a tunable-length delay (TLD) to a root clock, to generate a TLD clock, detecting a voltage droop in a supply voltage, generating a voltage tracking clock generator (VTCG) clock with a frequency finely tuned to two or more values to correspond to a magnitude of the supply voltage during the voltage droop, and selecting as an ACD clock to be provided to an electronic circuit, the VTCG clock during the voltage droop and the TLD clock when there is no voltage droop detected.

Yet another exemplary aspect is directed to an apparatus comprising means for adding a tunable-length delay (TLD) to a root clock to generate a TLD clock, means for detecting a voltage droop in a supply voltage, means for generating a voltage tracking clock generator (VTCG) clock with a frequency finely tuned to two or more values to correspond to a magnitude of the supply voltage during the voltage droop, and means for selecting as a clock to be provided to an electronic circuit, the VTCG clock during the voltage droop and the TLD clock when there is no voltage droop detected.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects of this disclosure are directed to an exemplary adaptive clock distribution (ACD) system comprising a voltage tracking clock generator (VTCG) configured to generate a clock (referred to herein as a "VTCG clock") whose frequency tracks variations in supply voltage. Thus, if there is a voltage droop, the frequency of the VTCG clock is finely tailored to the magnitude of the voltage droop. Accordingly, the exemplary ACD system improves performance of a corresponding electronic circuit by adaptively reducing the clock frequency of the electronic circuit by a variable amount, the variable amount corresponding to the magnitude of the voltage droop. Thus, based on the magnitude of the voltage droop, the clock frequency can be finely tailored to take on two or more values other than a normal operating frequency in exemplary aspects, in contrast to the single value of half the clock frequency for all voltage droop events, regardless of the magnitude, like in the aforementioned ACD system of the '041 Application.

In exemplary aspects, the VTCG may be implemented using a ring oscillator, for example, comprising a selectable number of delay elements (e.g., inverters and accompanying logic) whose effective delay is caused to correspond to the supply voltage. Thus, as the supply voltage changes, e.g., in the event of a voltage droop, the VTCG clock period is increased or in other words, the clock frequency of the ring oscillator is correspondingly decreased, based on the magnitude of the supply voltage. In various implementations, selectable numbers of one or more of: one or more coarse-grained delay elements and one or more fine-grained delay elements may be included in the ring oscillator's delay path to obtain a finely tuned variation in frequency of the VTCG clock.

The exemplary ACD system includes a tunable-length delay (TLD) element configured to generate a delayed clock (or "TLD clock") by adding a programmable delay to a system clock (or "root clock") generated by a PLL, for example. The TLD clock is supplied as one input to a clock selector, as well as to the VTCG. The VTCG clock is supplied as another input to the clock selector. A voltage droop detector may be used to detect a voltage droop. If there is a voltage droop, the voltage droop detector may raise an error signal (also referred to as a warning signal) which is synchronized with the TLD clock and provided to an adaptive control unit (ACU) and the VTCG. The VTCG controls the clock selector to select the VTCG clock in the event of a voltage droop; otherwise the clock selector may select the TLD clock.

The output of the clock selector is referred to as the "ACD clock" which may be distributed to sequential elements (e.g., flip-flops or latches) of an electronic circuit and after being passed through one or more buffers or drivers, may be supplied to various nodes (or "leaf nodes") of the electronic circuit. The programmable delay introduced between the root clock and the ACD clock by the TLD provides a response time which allows the following events to take place: the voltage droop detector detects the voltage droop; the output of the voltage droop detector is synchronized to the TLD clock; and the clock selector is caused to select the VTCG clock as the ACD clock. Once the ACD clock at the output of the clock selector is switched to the VTCG clock, the ACU causes the VTCG to be enabled and generate the VTCG clock in a glitch free manner, wherein the VTCG clock is adapted to changes in the supply voltage variation, thus adapting the clock period based on the voltage droop for the paths in the electronic circuit. Thus, in contrast to the ACD system of the '041 Application wherein the clock frequency is constantly reduced in half during a voltage droop event, the exemplary VTCG provides a finely tuned clock period which varies based on the impact of the supply voltage variation on circuit delay through the electronic circuit during each clock cycle, which improves performance during the voltage droop event.

Some aspects of this disclosure are also directed to calibration of the VTCG, wherein, a thermometric code of the VTCG clock may be made to match a thermometric code associated with the root clock's frequency. The above and additional aspects will now be described in further detail with reference to the figures.

Figure 1:
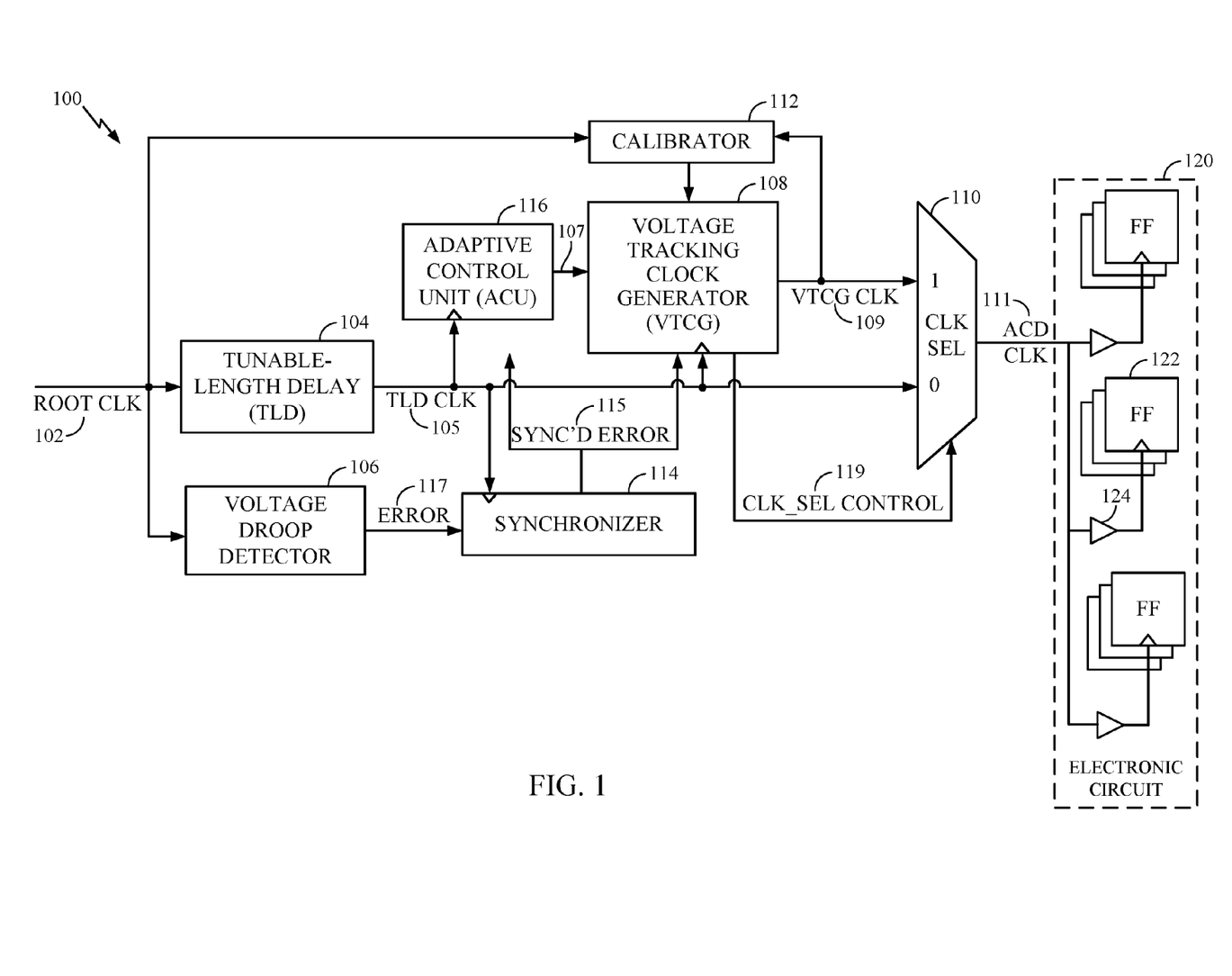
FIG. 1 illustrates an adaptive clock distribution system with a voltage tracking clock generator, according to an exemplary aspect of this disclosure.

With reference to FIG. 1, an adaptive clock distribution (ACD) system 100 is illustrated. ACD system 100 receives root clock 102 as an input (e.g., from PLL, not shown) and generates ACD clock 111 at its output. ACD clock 111 may be supplied to sequential elements such as flip-flops (FFs) 122, provided to various delay elements or drivers 124, and supplied to other leaf nodes of electronic circuit 120. Electronic circuit 120 may be any integrated circuit such as a processing system or SoC. ACD system 100 and electronic circuit 120 may be powered by the same voltage supply (not explicitly shown), wherein the frequency of ACD clock 111 may be varied to adapt to changes in the voltage supply, such as during voltage droop events.

In further detail, ACD system 100 includes tunable-length delay (TLD) 104, configured to introduce a programmable delay on root clock 102, to generate a delayed clock shown as TLD clock 105. TLD 104 may be implemented using delay elements such as inverters, buffers, multiplexers, etc., to introduce the programmable delay of one or more clock cycles (e.g., 2.5 clock cycles in some implementations, which may be recognized as a minimum number of clock cycles required for detecting the voltage droop and causing VTCG clock 109 to be selected as ACD clock 111). As previously explained, the programmable delay provides a response time and protects electronic circuit 120 from exposure to errors or other causes of degradation when the voltage droop occurs. If there is no voltage droop, clock selector 110 is configured to select TLD clock 105 as ACD clock 111.

ACD system 100 also includes voltage droop detector 106 configured to detect the onset of a voltage droop. Voltage droop detector 106 may be configured according to various implementations known in the art, and so, exhaustive details of voltage droop detector 106 will not be supplied herein. In one example, voltage droop detector 106 may be configured to detect the onset of a voltage droop based on a timing margin which is equal to a timing difference between a clock period of root clock 102 (root clock 102 is shown as an input to voltage droop detector 106) and a time delay of a tunable delay path (not shown) in voltage droop detector 106. The timing margin may be compared to a specified timing margin threshold to indicate if the timing margin threshold is violated (or in other words, the timing margin is negative or exceeds the timing margin threshold in a negative direction) or if the timing margin threshold is not violated (i.e., the timing margin is positive).

If there is no voltage droop, the timing margin would be positive. On the other hand, if there is a voltage droop, then the time delay of the tunable delay path will be larger, as it takes more time for a signal to traverse the tunable delay path when the supply voltage is reduced and correspondingly, the timing margin would become negative. If the timing margin is negative, an indication, shown as error 117 is provided by voltage droop detector 106. ACD system 100 includes synchronizer 114, which is a synchronizer circuit configured to synchronize error 117 to TLD clock 105, and provide synchronized error 115 to VTCG 108 and adaptive control unit (ACU) 116, which will be explained in further detail in the following sections. In a native state or normal operating conditions, i.e., if there is no voltage droop, clock selector 110 is configured to select TLD clock 105 as ACD clock 111, as previously mentioned. Based on synchronized error 115, ACU 116 causes VTCG 108 to assert clock selector control 119 and cause clock selector 110 to switch the selection of ACD clock 111 from TLD clock 105 to VTCG clock 109. ACU 116 which also receives synchronized error 115 as an input, causes VTCG 108 to be enabled, on the next rising clock edge of TLD clock 105, for example, by asserting the signal shown as VTCG enable 107.

Figure 3A:
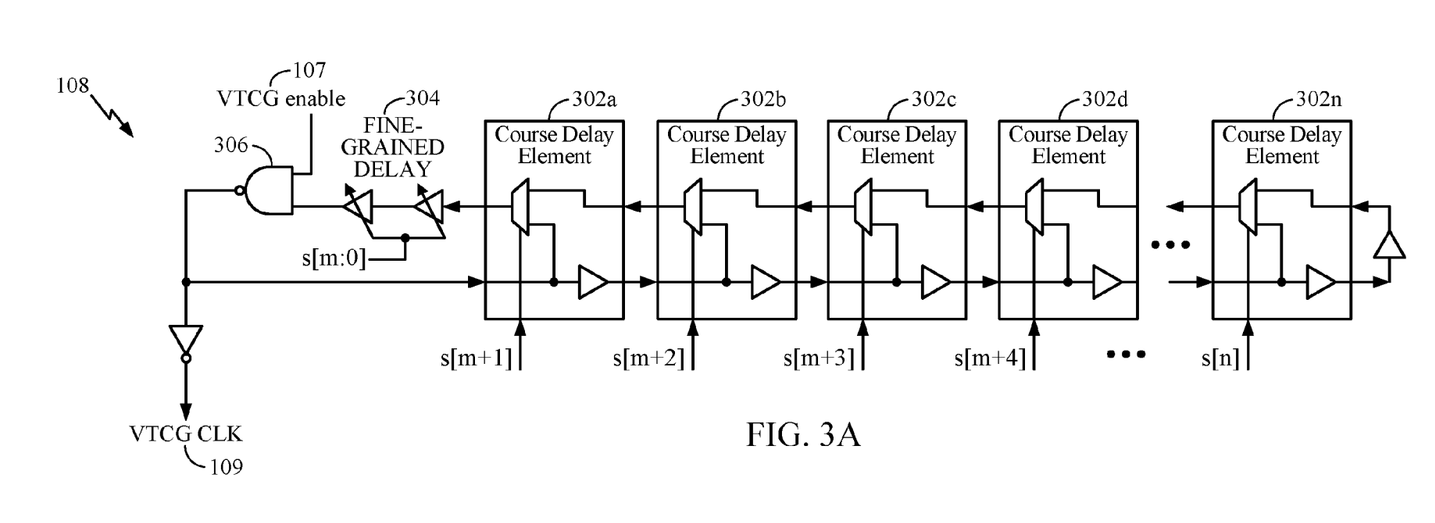
FIGS. 3A-B relate to an implementation of a voltage tracking clock generator, according to an exemplary aspect of this disclosure.

VTCG 108 includes a ring oscillator (RO) with configurable delay (as shown in FIG. 3, the ring oscillator may comprise a combination of fine-grained and course-grained delay elements). When VTCG enable 107 is asserted, the ring oscillator's clock frequency is configured to track the magnitude of the supply voltage, and therefore, the duration of the clock period of VTCG clock 109 (and hence the frequency of VTCG clock 109) is a function of the supply voltage. VTCG 108 also comprises selection logic (not shown) configured to generate the aforementioned clock selector control 119. The selection logic generates clock selector control 119 and VTCG enable 107 is provided by ACU 116 in a manner which ensures that a glitch does not occur on ACD clock 111 when the output of clock selector 110 is switched from TLD clock 105 to ACD clock 111. Thus, correct functionality and desired performance of electronic circuit 120 is maintained at the corresponding reduced frequency of ACD_clock 111 in the event of a voltage droop.

Figure 2:
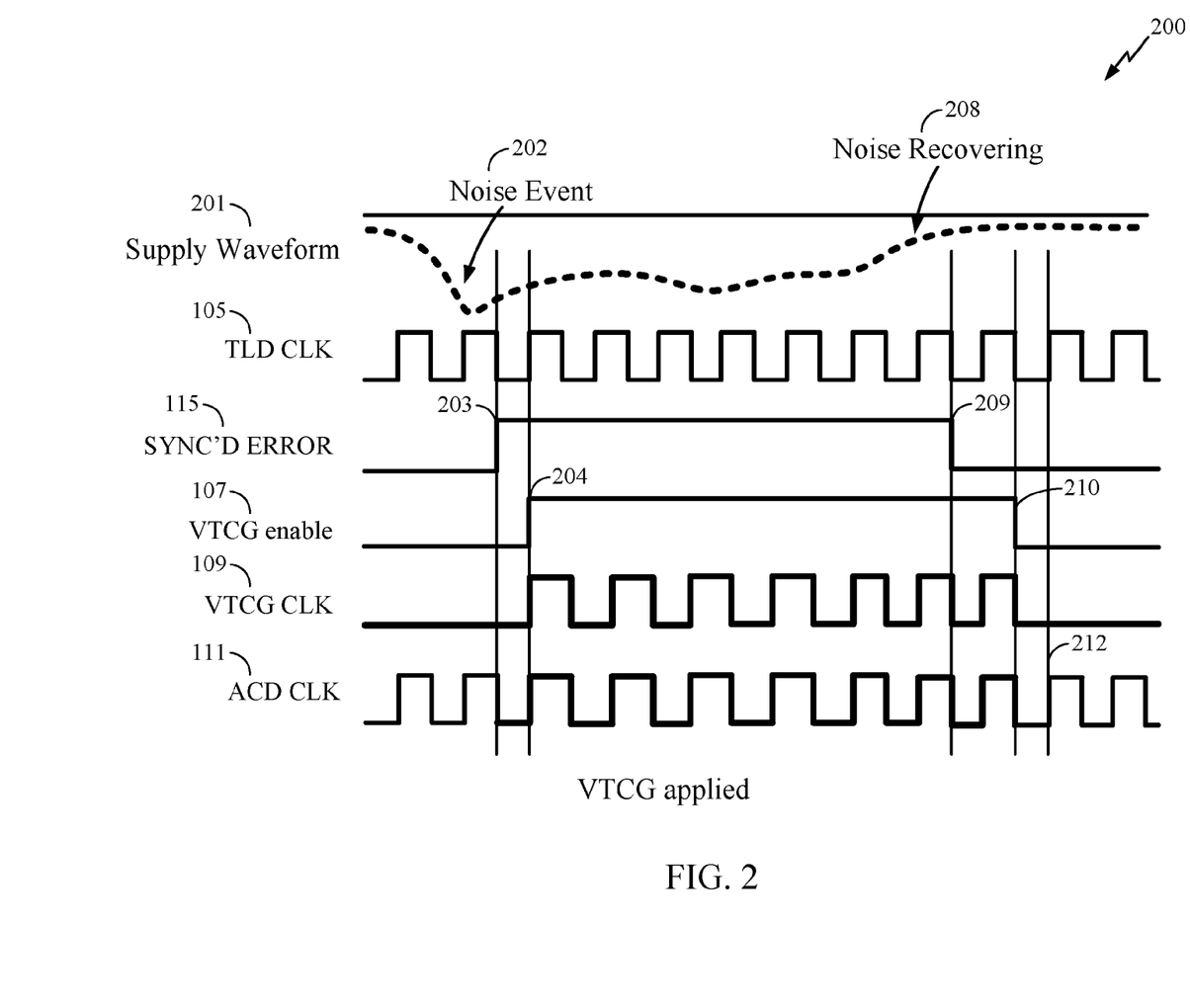
FIG. 2 illustrates an example timing diagram related to an operation of the adaptive clock distribution system of FIG. 1.

The glitch-free switch effected by clock selector 110 from TLD clock 105 to VTCG clock 109 in the event of a voltage droop (as well as the switch back to TLD clock 105 once the voltage droop ceases to be in effect) will now be explained with reference to timing diagram 200 of FIG. 2. In timing diagram 200, supply waveform 201 illustrates a variation in the magnitude of the supply voltage for ACD system 100 and electronic circuit 120 of FIG. 1. As shown in supply waveform 201, a voltage droop occurs at a time instance designated as noise event 202. Prior to noise event 202, TLD clock 105 is selected at clock selector 110 and provided as ACD clock 111 to electronic circuit 120. Following noise event 202, it takes up to one clock cycle of root clock 102 (not shown in FIG. 2) for voltage droop detector 106 to detect the voltage droop and assert error 117, and then another 1.5 to 2 clock cycles later, error 117 may be synchronized in synchronizer 114 to generate synchronized error 115. Synchronized error 115 is synchronized to TLD clock 105 (e.g., to a falling edge of TLD clock 105 in the example illustration of FIG. 2) at time 203 and provided to ACU 116 and VTCG 108. Based on synchronized error 115, clock selector control 119 (not shown in FIG. 2) is asserted to switch the output of clock selector, ACD clock 111, from TLD clock 105 to VTCG clock 109. At time 203, VTCG clock 109 is low, to ensure that a glitch is avoided in ACD clock 111. On the next rising edge of TLD clock 105, i.e., time 204, VTCG enable 107 is asserted by ACU 116 and correspondingly, VTCG 108 generates VTCG clock 109. Correspondingly, at time 204, ACD clock 111 is caused to be supplied by VTCG clock 109, which is adapted to the voltage droop.

Once the voltage droop event expires and supply waveform returns to the normal voltage supply level, at noise recovering event 208, the reverse process for switching back to TLD clock 105 starts. At time 209, synchronized error 115 is de-asserted after voltage droop detector 106 ceases to detect a voltage droop and de-asserts error 117 which gets synchronized in synchronizer 114 to de-assert synchronized error 115. On the next falling edge of VTCG clock 109, VTCG enable 107 is de-asserted by ACU 116, at time 210, and VTCG clock 109 remains low. Correspondingly, at time 210, clock selector control 119 is de-asserted by VTCG 108 to switch back ACD clock 111 to TLD clock 105 in a glitch-free manner.

Returning to FIG. 1, calibrator 112 may be used to calibrate the frequency of the ring oscillator of VTCG 108 to root clock 102, for example, after a processor reboot, wake up from sleep mode, or a change in the frequency of root clock 102. An all-digital implementation of calibrator 112 wherein a thermometric code of VTCG 108 is made to match a thermometric code of root clock 102 will be explained with reference to FIGS. 4A-B, following a description of the ring oscillator of VTCG 108 which will now be provided with reference to FIG. 3.

Figure 3B:
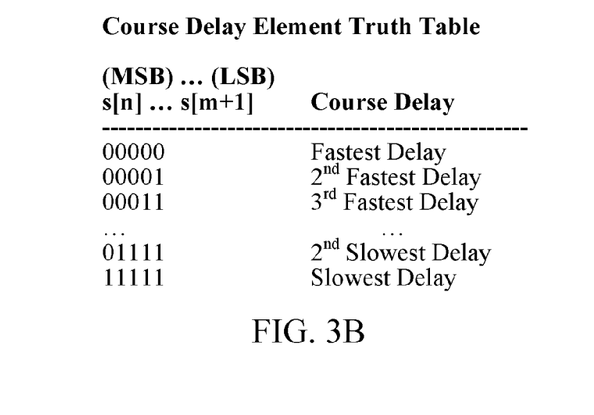

With combined reference now to FIGS. 1 and 3A-B, an example implementation of the ring oscillator of VTCG 108 will be described. FIG. 3A shows an example implementation of the ring oscillator comprising a combination of one or more coarse-grained delay elements 302*a-n* and/or one or more fine-grained delay elements, collectively shown as fine-grained delay elements 304. As previously mentioned, VTCG 108 is powered by the same supply voltage which supplies power to electronic circuit 120. Course-grained delay elements 302*a-n* and fine-grained delay elements 304 may be powered by supply voltage VTCG 108 and the delay through course-grained delay elements 302*a-n* and fine-grained delay elements 304 can be provided as VTCG clock 109, e.g., using a logic gate 306 (e.g., a NAND gate) when VTCG enable 107 is asserted. The number of course-grained delay elements 302*a-n* and fine-grained delay elements 304 which are selected for particular configurations of VTCG 108 are programmable. When the supply voltage is at its expected or normal level (i.e., there are no voltage droops), the delay provided by the combination of course-grained delay elements 302*a-n* and fine-grained delay elements 304 is programmed to match (or in some cases, be marginally greater than) the clock period of root clock 102.

Course-grained delay elements 302*a-n* can include one or more inverters or buffers intercoupled in a ring-oscillator configuration and fine-grained delay elements 304 can include inverters or buffers. FIG. 3B illustrates a truth table corresponding to an example implementation of course-grained delay elements 302*a-n* of FIG. 3A. A digital code comprising n+1 bits (s[n:0]) may be used to control the overall delay, with n−(m+1) bits (s[n: (m+1)]) used to control the course-grained delay and m+1 bits (s[m:0]) used to control the fine-grained delay. Focusing on an example course-grained delay element 302*a*, for example, if s[m+1] is high, then a multiplexor logic of course-grained delay element 302*a* causes a delay through course-grained delay element 302*a* to be selectively included in the ring oscillator's delay path and if s[m+1] is low, then a delay through course-grained delay element 302*a* is selectively excluded. Similarly, each one of course-grained delay element 302*a-n* can be selectively included or excluded from the delay path of the ring oscillator by corresponding bits of s[n: (m+1)] being set to "1" or "0", respectively. When all of course-grained delay element 302*a-n* are excluded, i.e., all bits of s[n: (m+1)] are "0", then as seen from the table, the least or fastest delay results, and when all of course-grained delay element 302*a-n* are included, i.e., all bits of s[n: (m+1)] are "1" the largest or slowest delay path results, with intermediate delay values between the fastest and slowest paths achieved based on various intermediate values of s[n: (m+1)]. Similarly, fine-grained delay elements 304 may also be controlled to provide programmable delay by turning on or off selective delay elements such as inverters or buffers in the delay path of the ring oscillator, using the signals s[m:0].

In the event of a voltage droop, the delay through the combination of course-grained delay elements 302*a-n* and fine-grained delay elements 304 is increased (e.g., by correspondingly setting the bits of s[n+1:0], causing the clock period of VTCG clock 109 to correspondingly increase. In this manner, the clock period of VTCG clock 109, and correspondingly the frequency of VTCG clock 109 is made to track the changes in the supply voltage.

Figure 4A:
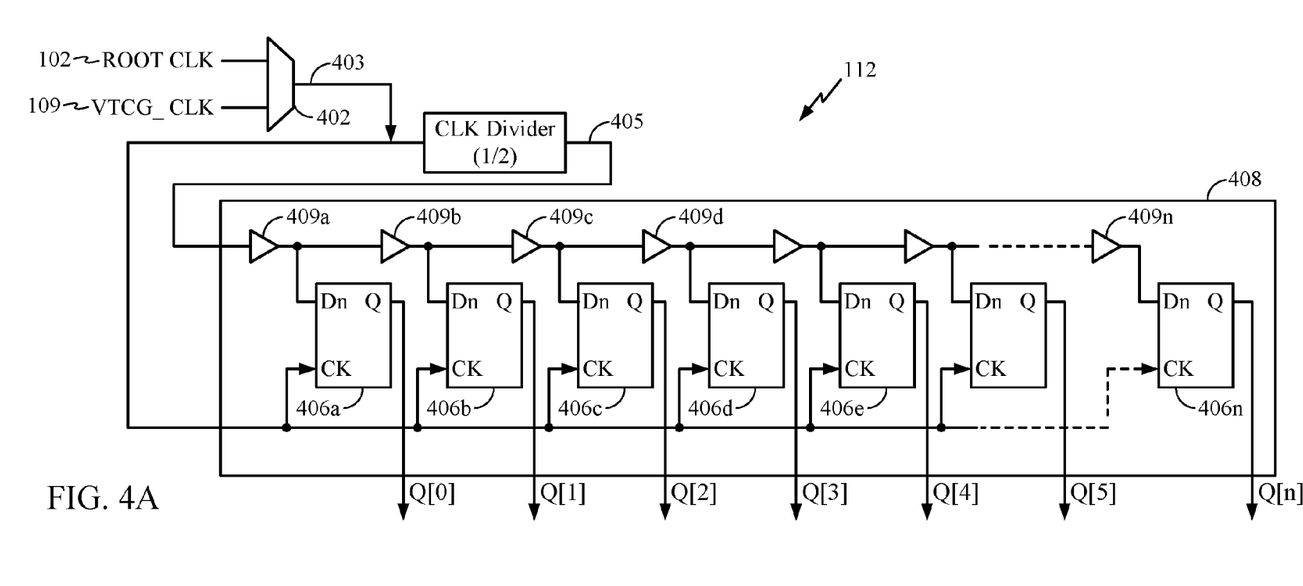
FIGS. 4A-B relate to an implementation of a calibrator for calibrating a voltage tracking clock generator, according to an exemplary aspect of this disclosure.

As will be explained with reference to FIGS. 4A-B, calibrator 112 can be employed to program the clock period of VTCG clock 109 in this manner, to match the clock period of root clock 102. With reference now to FIG. 4A, an example implementation of calibrator 112 is shown. As shown, calibrator 112 is configured as a digital circuit designed to perform calibration of VTCG 108 using Vernier delay measurement techniques. Calibrator 112 includes selector 402 configured to select either root clock 102 or VTCG clock 109 as selected clock 403 provided to clock divider 404 and to time-to-digital converter (TDC) 408. Clock divider 404 may divide the frequency of selected clock 403 by a factor (e.g., a factor of 2 in the implementation shown), to generate divided clock 405. TDC 408 includes a set of flip-flops 406*a-n*. Flip-flops 406*a-n* which may be metastability detecting flip-flops, may be clocked by selected clock 403. Divided clock 405 is sequentially delayed by a variable number of delay buffers 409a-n before being provided as inputs D0-Dn to flip-flops 406a-n. An example operation of TDC 408 in converting the period of divided clock 405 to thermometric code will be explained below.

Figure 4B:
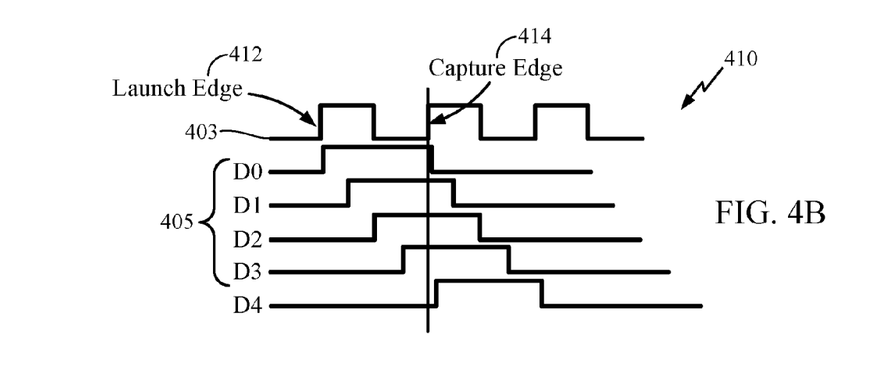

Referring to FIG. 4B, timing diagram 410 is illustrated with waveforms for selected clock 403 and sequentially delayed segments of divided clock 405. The clock period of divided clock 405 is twice the length of the clock period of selected clock 403 in an implementation where the frequency of selected clock 403 is divided in half by clock divider 404. Each of delay buffers 409a-n delays divided clock 405, as mentioned above. The delay provided by each delay buffer 409a-n is referred to as a "buffer delay". The time period of selected clock 403 between launch edge 412 and capture edge 414 represents a clock period of selected clock 403. At launch edge 412, all flip-flops 406a-n are enabled, as they are all clocked by selected clock 403. Correspondingly, the rising edge of divided clock 405 appears at inputs D0-D3 after a varying number of buffer delays inserted by delay buffers 409a-n. Before capture edge 414, flip-flops 406a-d will see their inputs D0-D3 go high, but the rising edges of inputs to the remaining flip-flops 406e-n (starting with D4 corresponding to flip-flop 406e, which has been specifically illustrated in the example timing diagram 410 of FIG. 4B) may occur after capture edge 414 is asserted.

As will be appreciated, the number of flip-flops 406a-n which can capture rising edges of divided clock 405 provide an indication of the number of buffer delays which can be contained within a clock period of selected clock 403. In other words, the clock period of selected clock 403 can be expressed in terms of the number of flip-flops 406a-n which registered a rising edge of divided clock 405 at their inputs. Following capture edge 414, outputs Q[0]-Q[3] of flip-flops 406a-d will be high or "1" in this case, while outputs Q[4]-[Q[n] will remain low. The values on outputs Q[0]-[Q[n] of flip-flops 406a-n (i.e., four "1"s for Q[0]-Q[3], followed by "0"s for Q[4]-Q[n] in this case) is referred to as a thermometric code representation of the clock period of selected clock 403. The thermometric code of the clock period of selected clock 403 measured in this way can be stored (e.g., in another storage medium, such as memory buffers not shown explicitly).

In an aspect, calibrator 112 can be used to calibrate VTCG 108 by first determining the clock period of root clock 102, e.g., in terms of its thermometric code in the manner described above by selecting root clock 102 as selected clock 403 at selector 402. The thermometric code for root clock 102, referred to as a root clock thermometric code, can be stored, and then selector 402 can be reconfigured to select VTCG clock 109 as selected clock 403. The thermometric code of VTCG clock 109 can similarly be determined to obtain a VTCG clock thermometric code. If the VTCG clock thermometric code matches the root clock thermometric code, then the clock periods of VTCG clock 109 and root clock 102 are determined to be the same and VTCG 108 is considered to be accurately calibrated. If the VTCG clock thermometric code does not match the root clock thermometric code, then a calibration cycle or loop of calibrating VTCG 108 is commenced, wherein course-grained delay elements 302a-n and fine-grained delay elements 304 are adjusted to vary the clock period of VTCG clock 109 until VTCG clock thermometric code matches the root clock thermometric code when VTCG 108 is determined to be calibrated. After the calibration, a small timing guard band may be included in some aspects, to increase the clock period of VTCG clock 109, as compared to the clock period of root clock 102. The timing guard band may be introduced, for example, by programming one or more additional delay elements in the ring oscillator of VTCG 108. This allows the clock frequency of the VTCG clock 109 to be marginally less than the clock frequency of root clock 102.

Figure 5:
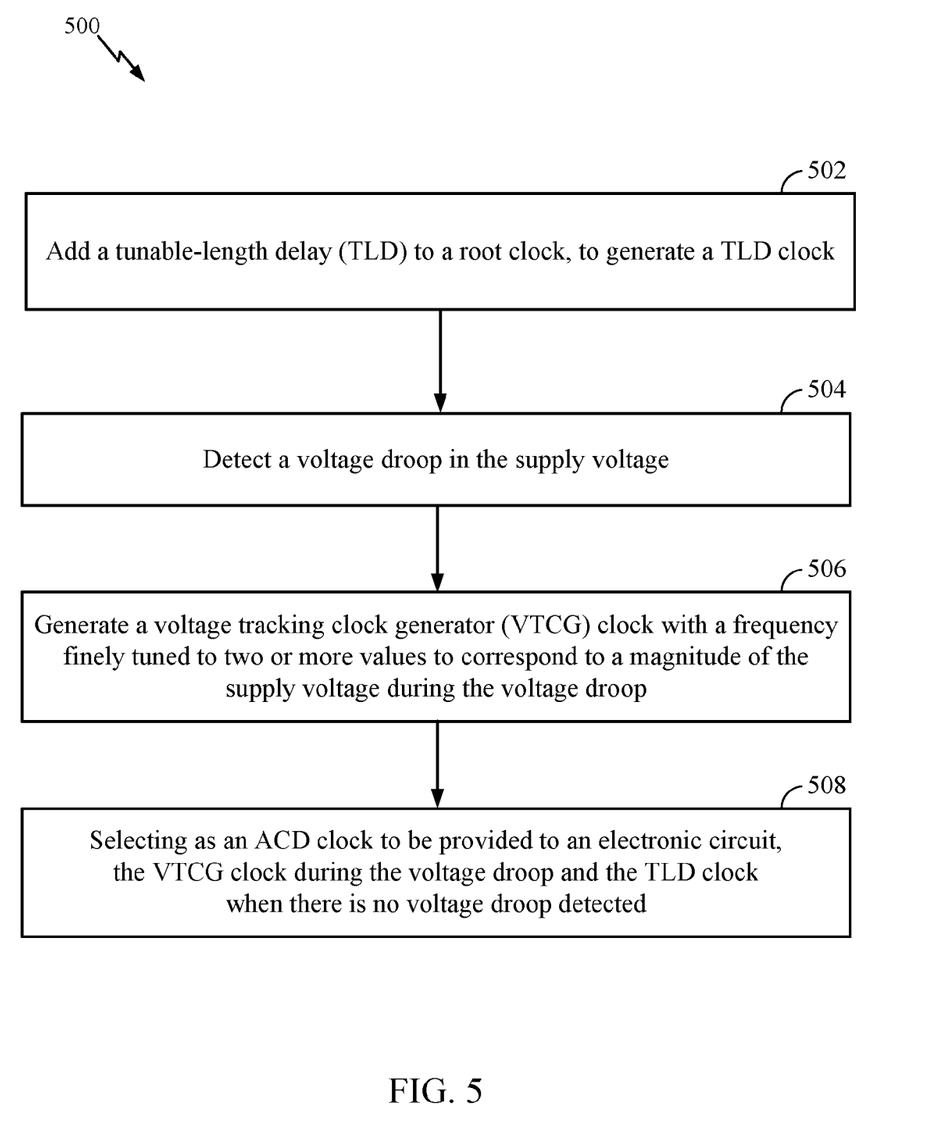
FIG. 5 illustrates a flow-chart corresponding to a method of operating an adaptive clock distribution system, according to an exemplary aspect of this disclosure.

It will be appreciated that exemplary aspects include various methods for performing the processes, functions and/or algorithms disclosed herein. For example, as illustrated in FIG. 5, an exemplary aspect can include a method (500) of operating an adaptive clock distribution system.

Block 502 of method 500 comprises adding a tunable-length delay (TLD) to a root clock (e.g., in TLD 104), to generate a TLD clock (e.g., TLD clock 105).

Block 504 comprises detecting a voltage droop in the supply voltage (e.g., in voltage droop detector 106).

Block 506 comprises generating a voltage tracking clock generator (VTCG) clock (e.g., VTCG clock 109) with a frequency finely tuned to two or more values to correspond to a magnitude of the supply voltage during the voltage droop (e.g., in VTCG 108).

Figure 6:
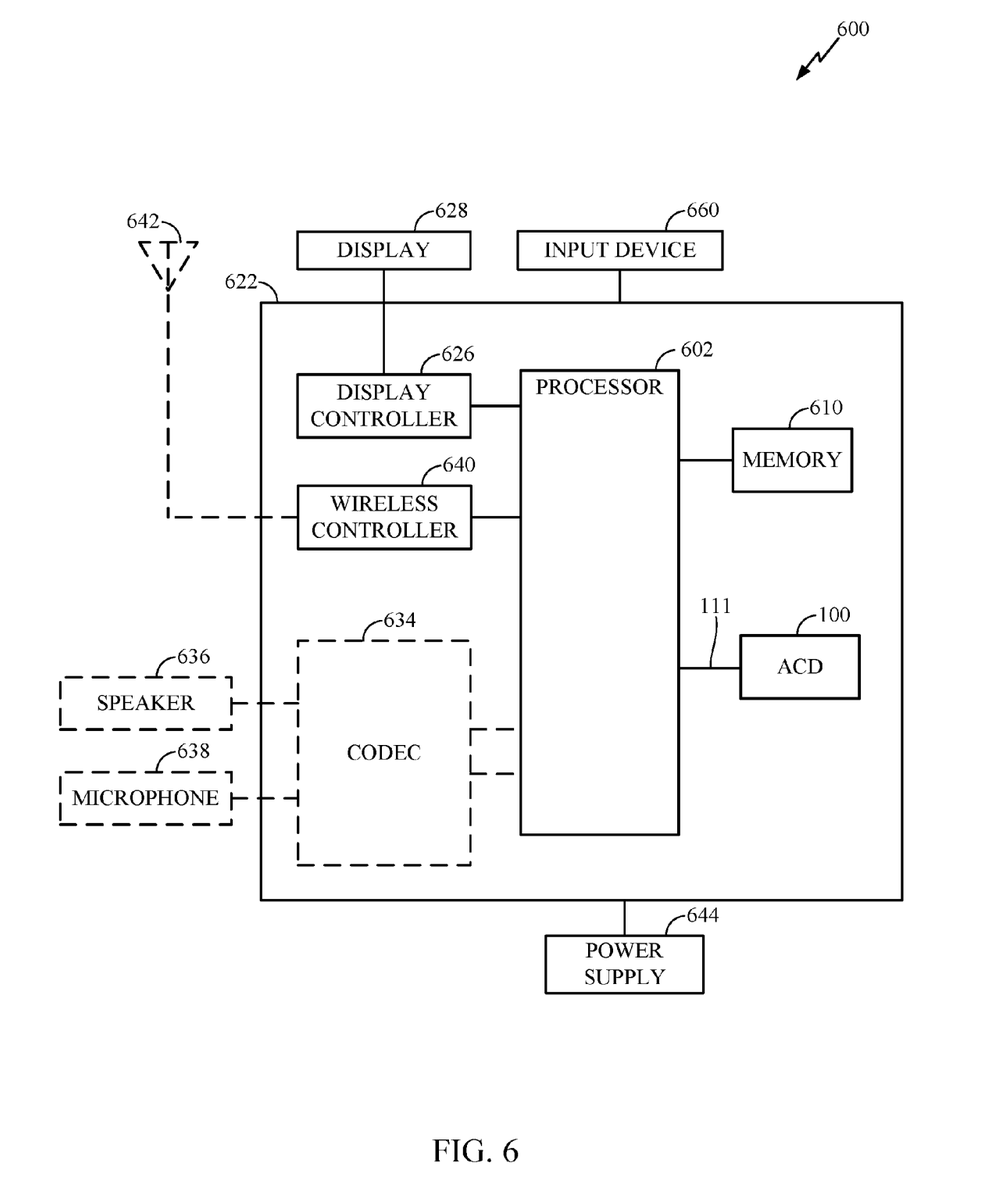
FIG. 6 depicts an exemplary computing device in which an aspect of the disclosure may be advantageously employed.

Block 508 comprises selecting (e.g., in clock selector 110) as an ACD clock (e.g., ACD_clock 111) to be provided to an electronic circuit (e.g., electronic circuit 120), the VTCG clock during the voltage droop and the TLD clock when there is no voltage droop detected An example apparatus in which exemplary aspects of this disclosure may be utilized, will now be discussed in relation to FIG. 6. FIG. 6 shows a block diagram of computing device 600. Computing device 600 may is shown to include processor 602 which may include or correspond to electronic circuit 120 of FIG. 1, with ACD system 100 of FIG. 1 configured to provide ACD clock 111 for clocking processor 602. For example, voltage supply for processor 602 and ACD system 100 may be supplied from power supply 644, and ACD system 100 may be configured to detect voltage droops in the voltage supply and provide ACD clock 111 with variable frequency which tracks the magnitude of the supply voltage during the voltage droop according to method 500 of FIG. 5 in some aspects. Various details of ACD system 100 have been omitted from this view but aspects of ACD system 100 may be configured similar to FIGS. 1, 3A-B, and 4A-B as previously described.

In FIG. 6, processor 602 is also shown to be coupled to memory 610, and display controller 626 coupled to processor 602 and to display 628. In some cases, computing device 600 may be used for wireless communication and FIG. 6 also shows optional blocks in dashed lines, such as coder/decoder (CODEC) 634 (e.g., an audio and/or voice CODEC) coupled to processor 602 and speaker 636 and microphone 638 can be coupled to CODEC 634; and wireless antenna 642 coupled to wireless controller 640 which is coupled to processor 602. Where one or more of these optional blocks are present, in a particular aspect, processor 602, display controller 626, memory 610, and wireless controller 640 are included in a system-in-package or system-on-chip device 622.

Accordingly, a particular aspect, input device 630 and power supply 644 are coupled to the system-on-chip device 622. Moreover, in a particular aspect, as illustrated in FIG. 6, where one or more optional blocks are present, display 628, input device 630, speaker 636, microphone 638, wireless antenna 642, and power supply 644 are external to the system-on-chip device 622. However, each of display 628, input device 630, speaker 636, microphone 638, wireless antenna 642, and power supply 644 can be coupled to a component of the system-on-chip device 622, such as an interface or a controller.

It should be noted that although FIG. 6 generally depicts a computing device, processor 602 and memory 610, may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for operating an adaptive clock distribution system. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An adaptive clock distribution (ACD) system comprising:
    a tunable-length delay (TLD) circuit configured to add a preselected delay to a root clock, to generate a TLD clock;
    a voltage droop detector configured to detect a voltage droop in a supply voltage; and
    a voltage tracking clock generator (VTCG) configured to generate a VTCG clock, wherein a frequency of the VTCG clock is finely tuned to one of two or more values to correspond to a magnitude of the supply voltage during the voltage droop; and
    a clock selector configured to select the VTCG clock as an ACD clock to be provided to an electronic circuit during the voltage droop and the TLD clock as the ACD clock when there is no voltage droop detected.

2. The ACD system of claim 1, further comprising a synchronizer and an adaptive control unit (ACU), wherein the voltage droop detector is configured to generate an error signal when the voltage droop is detected, and wherein the synchronizer is configured to synchronize the error signal to the TLD clock to generate a synchronized error and provide the synchronized error to the ACU and the VTCG.

3. The ACD system of claim 2, wherein the VTCG is configured to provide a control to the clock selector to select the VTCG clock as the ACD clock based on the synchronized error.

4. The ACD system of claim 2, wherein the ACU is configured to enable the VTCG to generate the VTCG clock based on the synchronized error.

5. The ACD system of claim 2, wherein the voltage droop detector is configured to generate the error signal if a timing margin is negative, wherein the timing margin is a difference between a clock period of the root clock and a time delay of a tunable delay path, wherein the time delay of the tunable delay path increases during the voltage droop.

6. The ACD system of claim 1, wherein the two or more values of the frequency of the VTCG clock during the voltage droop are less than a frequency of the TLD clock.

7. The ACD system of claim 1, wherein the root clock is generated by a phase-locked loop (PLL).

8. The ACD system of claim 1, wherein the VTCG comprises a ring oscillator, wherein a frequency of the VTCG clock is based on a delay of the ring oscillator, and wherein the delay of the ring oscillator is based on the supply voltage.

9. The ACD system of claim 8, wherein the delay of the ring oscillator is adjusted based on delays through selectable numbers of one or more of: one or more coarse-grained delay elements or one or more fine-grained delay elements.

10. The ACD system of claim 1, further comprising a calibrator configured to match the frequency of the VTCG clock to a frequency of the root clock.

11. The ACD system of claim 10, wherein the calibrator comprises a set of flip-flops configured to convert a clock period into a thermometric code.

12. The ACD system of claim 11, wherein the calibrator is configured to match a thermometric code of a clock period of the VTCG clock to a thermometric code of a clock period of the root clock.

13. A method of operating an adaptive clock distribution (ACD) system, the method comprising:
    adding a tunable-length delay (TLD) to a root clock, to generate a TLD clock;
    detecting a voltage droop in a supply voltage;
    generating a voltage tracking clock generator (VTCG) clock with a frequency finely tuned to two or more values to correspond to a magnitude of the supply voltage during the voltage droop; and selecting as an ACD clock to be provided to an electronic circuit, the VTCG clock during the voltage droop and the TLD clock when there is no voltage droop detected.

14. The method of claim 13, comprising:
generating an error signal when the voltage droop is detected;
synchronizing the error signal to the TLD clock to generate a synchronized error; and
selecting the ACD clock and enabling the VTCG based on the synchronized error.

15. The method of claim 14, comprising generating the error signal if a timing margin is negative, wherein the timing margin is a difference between a clock period of the root clock and a time delay of a tunable delay path, wherein the time delay of the tunable delay path increases during the voltage droop.

16. The method of claim 13, comprising generating the root clock from a phase-locked loop (PLL).

17. The method of claim 13 comprising generating the VTCG clock from a ring oscillator wherein a delay of the ring oscillator is based on the supply voltage.

18. The method of claim 17, comprising adjusting the delay of the ring oscillator based on selecting delays through one or more of: one or more coarse-grained delay elements or one or more fine-grained delay elements.

19. The method of claim 13, further comprising calibrating the frequency of the VTCG clock to match a frequency of the root clock.

20. The method of claim 19, comprising matching a thermometric code of a clock period of the VTCG clock to a thermometric code of a clock period of the root clock.

21. An apparatus comprising:
means for adding a tunable-length delay (TLD) to a root clock to generate a TLD clock;
means for detecting a voltage droop in a supply voltage;
means for generating a voltage tracking clock generator (VTCG) clock with a frequency finely tuned to two or more values to correspond to a magnitude of the supply voltage during the voltage droop; and
means for selecting as a clock to be provided to an electronic circuit, the VTCG clock during the voltage droop and the TLD clock when there is no voltage droop detected.

22. The apparatus of claim 21, further comprising:
means for generating an error signal when the voltage droop is detected;
means for synchronizing the error signal to the TLD clock to generate a synchronized error; and
means for selecting the clock and enabling the VTCG based on the synchronized.

23. The apparatus of claim 22, further comprising means for generating the error signal if a timing margin is negative, wherein the timing margin is a difference between a clock period of the root clock and a time delay of a tunable delay path, wherein the time delay of the tunable delay path increases during the voltage droop.

24. The apparatus of claim 21, further comprising means for generating the root clock from a phase-locked loop (PLL).

25. The apparatus of claim 21, wherein the means for generating the VTCG clock comprises means for selecting delays through one or more of: one or more coarse-grained delay elements or one or more fine-grained delay elements.

26. The apparatus of claim 25, further comprising means for calibrating the frequency of the VTCG clock to match a frequency of the root clock.

27. The apparatus of claim 26, comprising means for matching a thermometric code of a clock period of the VTCG clock to a thermometric code of a clock period of the root clock.

* * * * *